US008350592B1

(12) United States Patent
Malhan et al.

(10) Patent No.: US 8,350,592 B1
(45) Date of Patent: Jan. 8, 2013

(54) SINGLE SUPPLY DIGITAL VOLTAGE LEVEL SHIFTER

(75) Inventors: Bipin B. Malhan, Greater Noida (IN); Gaurav Goyal, Dehradun (IN); Umesh Chandra Lohani, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/356,626

(22) Filed: Jan. 23, 2012

(51) Int. Cl.
*H03K 19/0175* (2006.01)

(52) U.S. Cl. .................... 326/81; 326/68; 326/80

(58) Field of Classification Search .......... 326/62, 326/68, 80, 81; 327/333
See application file for complete search history.

(56) References Cited

U.S. PATENT DOCUMENTS

| | | | |
|---|---|---|---|
| 6,428,683 B1 | 8/2002 | Jaworowski | |
| 6,429,683 B1 | 8/2002 | Miller | |
| 6,954,100 B2 | 10/2005 | Dharne | |
| 7,009,424 B2 | 3/2006 | Khan | |
| 7,061,299 B2 | 6/2006 | Khan | |
| 7,102,410 B2 | 9/2006 | Khan | |
| 7,187,205 B2 | 3/2007 | Ramaraju | |
| 7,315,183 B2 * | 1/2008 | Hinterscher | 326/81 |
| 7,443,223 B2 | 10/2008 | Bajkowski | |
| 7,446,566 B1 | 11/2008 | Chrudimsky | |
| 7,548,093 B1 | 6/2009 | Priel et al. | |
| 7,560,970 B2 | 7/2009 | Cook | |
| 7,683,668 B1 | 3/2010 | Thakur | |
| 7,777,522 B2 | 8/2010 | Yang | |
| 7,808,286 B1 | 10/2010 | Miller | |
| 7,816,948 B1 | 10/2010 | Sanchez | |
| 7,956,662 B2 | 6/2011 | Arora | |
| 2010/0259311 A1 * | 10/2010 | Yang et al. | 327/333 |

OTHER PUBLICATIONS

Bo Zhang, Lipin Liang, Xingjun Wang, "A New Level Shifter with Low Power in Multi-Voltage System," IEEE, 2006.

* cited by examiner

*Primary Examiner* — Anh Tran
(74) *Attorney, Agent, or Firm* — Charles Bergere

(57) ABSTRACT

A single-supply digital voltage level shifter has a first inverter having a first input for receiving an input signal with a first voltage swing, and a first output for outputting a first output signal. A second inverter has a second input for receiving the first output signal, and a second output for outputting a second output signal with a second voltage swing, where the second output signal is a level-shifted version of the input signal. A comparison stage includes a first comparison stage input for receiving the input signal, a second comparison stage input for receiving the second output signal, and a comparison stage output for outputting a comparison stage output control signal. A control stage is connected in a circuit branch of the first inverter and has a control stage switch that assumes a non-conducting state dependent on a logical state of the comparison stage output control signal.

20 Claims, 2 Drawing Sheets

SINGLE SUPPLY DIGITAL VOLTAGE LEVEL
SHIFTER

BACKGROUND OF THE INVENTION

The present invention relates to integrated circuits and more particularly, to a single supply digital voltage level shifter.

Many of today's integrated circuits include sub-circuits or modules that operate at different voltage levels. Sometimes these modules are required to interface with one another, thereby requiring the voltage level of one circuit to be "shifted" with respect to the voltage level of the other circuit. Thus, there are transitions from one logic level to another during operation of the circuit. These transitions typically are between a logical high state at some voltage above ground level, and a logical low state at ground level. For example, the voltage in one module may have a logic high voltage level of 0.75V and the voltage in the other module may have a logic high voltage level of 1.32V. The first module has a voltage swing of zero to 0.75V and the second circuit has a voltage swing of zero to 1.32V. Level shifters provide the connection between two such circuits, shifting the level of the signals from the first voltage swing to the second voltage swing.

In conventional cross-coupled level shifter architectures, the need for two voltage supplies requires that the level shifter must be of a minimum physical size, a constraint which led to the development of the single supply level shifter, such as the conventional single supply level shifter 100 illustrated in FIG. 1. The single supply level shifter 100 requires only one supply $V_{DDH}$ to convert a low voltage signal $V_{DDL}$ at the input "in" to a higher voltage $V_{DDH}$. The consequential reduction in foot print realized by the removal of one of the voltage supplies, and the simplification of pin placement and wire routing leads to increased flexibility in where such level shifters can be placed.

The threshold drop across the N-type MOSFET n1 provides a virtual $V_{DDL}$ (the lower voltage of the input signal) to the input inverter p2, n2. However, this conventional design is at a significant disadvantage in that higher leakage currents can occur if the input signal supply level is lower or $V_{DDH}$ is higher than the input supply level by more than the threshold voltage of n1. Therefore, the level shifter 100 is limited in its range of input signal or power supply. Also, the diode-connected transistor n1 limits the operating speed of the level shifter 100.

Thus, there is a need for a single supply digital voltage level shifter that provides some improvement on the above-mentioned problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION OF THE INVENTION

Figure 1:
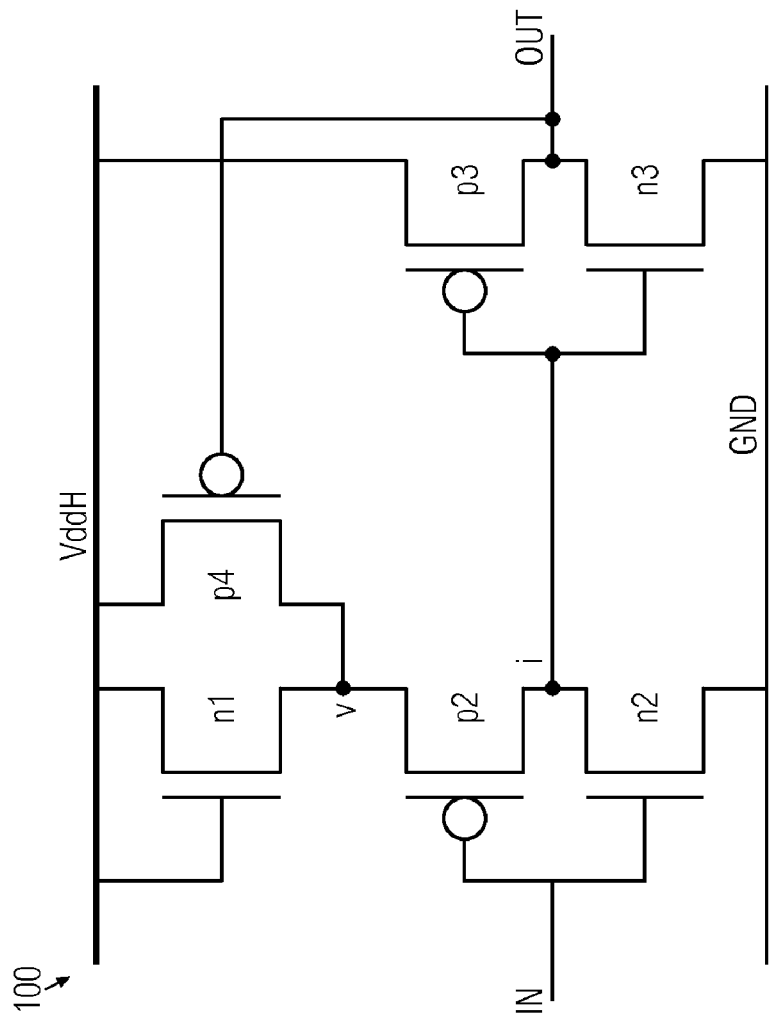
FIG. 1 is a schematic circuit diagram of a conventional single supply digital voltage level shifter.

In one embodiment, the present invention provides a single supply, digital voltage level shifter comprising: a first inverter having a first input for receiving an input signal of a first voltage swing, and a first output for outputting a first output signal; a second inverter having a second input for receiving the first output signal, and a second output for outputting a second output signal of a second voltage swing, the second output signal being a level-shifted version of the input signal; a comparison stage having a first comparison stage input for receiving the input signal, a second comparison stage input for receiving the second output signal, and a comparison stage output for outputting a comparison stage output control signal; and a control stage connected in a circuit branch of the first inverter, the control stage having a control stage switch that assumes a non-conducting state dependent on a logical state of the comparison stage output control signal.

In another embodiment, the present invention provides a method of operating a single supply digital voltage level shifter. The method includes the steps of: providing a first inverter having a first input for receiving an input signal of a first voltage swing, and a first output for outputting a first output signal; providing a second inverter having a second input for receiving first output signal, and a second output for outputting a second output signal of a second voltage swing, the second output signal being a level-shifted version of the input signal; providing a comparison stage having a first comparison stage input for receiving the input signal, a second comparison stage input for receiving the second output signal, and a comparison stage output for outputting a comparison stage output control signal; providing a control stage connected in a circuit branch of the first inverter, the control stage having a control stage switch; applying the input signal to the first input; and controlling the control stage switch to assume a non-conducting state dependent on a logical state of the comparison stage output control signal.

The single supply digital voltage level shifter of the present invention has reduced leakage current during switching operations as compared to conventional single supply level shifters. Using a single voltage supply obviates the need for ratioed logic, which is prevalent in double-supply, cross-coupled level shifter architectures. Thus, the circuit of the present invention has a smaller footprint than cross-coupled level shifters. Additionally, routing congestion may be reduced because a second power rail, which is required in cross-coupled architectures, is not required. Also, P-type MOSFETs (PMOSFETS) have one of their terminals used as a substrate terminal, called a well. When this terminal is connected to the MOSFET source terminal (the supply) in a double supply level shifter architecture requiring two power rails, then two different substrate terminals of the PMOSFET at two different supply levels must be biased, thereby requiring a large physical area for the footprint of the level shifter, and imposing limitations on attempts at miniaturization of the level shifter. In embodiments of the present invention, biasing of another well is not required.

Embodiments of the invention provide other significant technical benefits. For instance, provision of a control stage connected in a circuit branch of a first inverter, where the control stage has a control stage switch configured to assume a non-conducting state dependent on a logical state of the output signal from a comparison stage allows for a significant reduction in the leakage current. This reduced leakage current may be realized across a wide range of input and output voltage levels, which is a significant improvement over conventional level shifters such as that illustrated in FIG. 1.

As used herein, the terms "a" or "an" are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to distinguish between the elements such terms describe. Thus, these terms are not necessarily intended to indicate temporal or other prioritization of such elements.

Because the circuit elements used to realize the present invention are, for the most part, known to those skilled in the art, full technical details will not be explained in any greater extent than that considered necessary for the understanding and appreciation of the underlying concepts of the present invention and in order not to obfuscate or distract from the teachings of the present invention.

Embodiments of the invention may be implemented using a variety of different switching devices. For example, although FIG. 2 and the discussion thereof describe the use of MOSFETs in the digital voltage level shifter, other types of switching devices may be implemented. The exemplary single supply digital voltage level shifter is presented merely to provide a useful reference in discussing various aspects of the invention.

Figure 2:
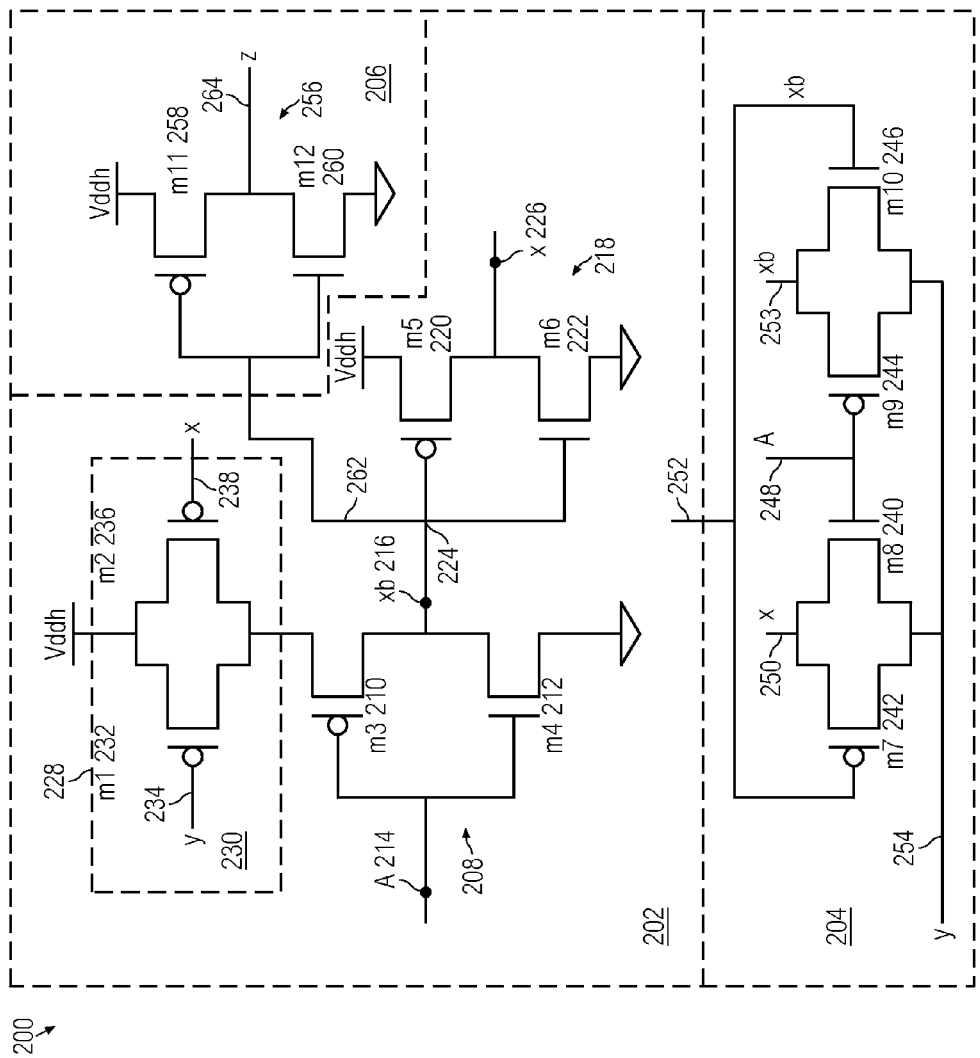
FIG. 2 is a schematic circuit diagram of a single supply digital voltage level shifter in accordance with an embodiment of the present invention.

Referring now to FIG. 2, a schematic circuit diagram of a single supply digital voltage level shifter 200 in accordance with an embodiment of the invention is shown. The level shifter 200 comprises a voltage translation stage 202, a comparison stage 204, and a driver stage 206. The voltage translation stage 202 receives an input voltage and translates the input voltage to a desired level shifted voltage. The comparison stage 204 compares the input signal with signals on nodes internal to the level shifter 200, for controlling the operation of the level shifter 200. The driver stage 206 drives the level-shifted output voltage.

The voltage translation stage 202 comprises a first inverter 208 comprising a complementary CMOS pair of PMOSFET m3 210 and NMOSFET m4 212. The first inverter 208 has a first input 214 at a node A for receiving an input signal which, although not shown in FIG. 2, is at a first or lower voltage level $V_{DDL}$. The gate terminals of m3 210 and m4 212 are tied together at node A, and the drain terminals are tied together at a node xb. A first output signal is provided at the first output 216 that is the logical inverse of the input signal, but translated to the second, higher voltage level $V_{DDR}$.

A second inverter 218 comprising a PMOSFET m5 220 and NMOSFET m6 222 has a second input 224 for receiving the first output signal 216 at the node xb. The drain terminals of m5 220 and m4 212 are tied together to provide a second output 226 for outputting a second output signal at a node x. The source terminal of m5 220 is connected to a voltage supply at the second, higher voltage level $V_{DDH}$, and the gate terminal of m5 220 is connected to the node xb and receives the first output signal. The first and second inverters 208 and 218 are connected to ground by way of the source terminals of the m4 212 and m6 222, respectively. The second output signal is the logical inverse of the first output signal and is a level-shifted version of the input signal, shifted from the lower, input voltage level $V_{DDL}$ to the higher, output voltage level $V_{DDH}$.

The voltage translation stage 202 further comprises a circuit branch 228 that connects the first inverter 208 to the high-level supply voltage $V_{DDH}$ by way of a control stage 230. The control stage 230 comprises a control stage switch m1 232 having a switch control input 234. In the embodiment of FIG. 2, the switch control input 234 of the control switch m1 232 is driven by an output at a node y of the comparison stage 204, as will be described below. The control stage 230 also comprises a second control stage switch m2 236 having a switch control input 238. In the embodiment of FIG. 2, the switch control input 238 is driven by the second output 226 at node x. In the embodiment of FIG. 2, the control stage switch 232 and the second control stage switch 236 are both PMOSFETs connected in parallel between the high-level voltage supply $V_{DDH}$ and the source terminal of the PMOSFET m3 210 of the first inverter 208.

The comparison stage 204 includes a first switch m8 240, which in the embodiment of FIG. 2 is an NMOSFET, and a second switch m7 242, which in this embodiment is a PMOSFET. Together, switches m8 240 and M7 242 comprise a first switch pair of the comparison stage 204. The comparison stage 204 also has a second switch pair comprising a first switch m9 244 (in this embodiment a PMOSFET) and second switch m10 246 (in this embodiment a NMOSFET).

The comparison stage 204 further comprises a first comparison stage input 248 connected to the gate terminals of the first switch m8 240 of the first switch pair and the first switch m9 of the second switch pair, and receives the input signal at node A. A second comparison stage input 250 is connected between the first switch m8 240 and the second switch 242 of the first switch pair and receives the second output signal on second output 226 at node x. A third comparison stage input 252 is connected to the gate terminals of the second switches m7 242 and m10 246 of the first and second switch pairs and receives the first output signal output from the first output 216 at node xb. A fourth comparison stage input 253 is connected between the first and second switches m9 244 and m10 246 of the second switch pair and receive the first output signal at node xb. The comparison stage 204 also has a comparison stage output 254 generated at a node y for outputting a comparison stage output control signal, described in greater detail below.

The first switch pair m8 240 and m7 242 are connected in parallel between the second comparison stage input 250 and the comparison stage output 254. The second switch pair m9 244 and m10 246 are connected in parallel between the fourth comparison stage input 253 and the comparison stage output 254. Since the second switch m7 242 of the first switch pair and the second switch m10 246 of the second switch pair have their gate terminals connected to the third comparison stage input 252, the two second switches are driven by the first output signal output on first output 216 at node xb.

The comparison stage output 254 on node y is used to control the control stage switch m1 232. In this embodiment, the comparison stage output 254 at node y is connected to the switch control input 234 of the control stage switch 232, in this instance the gate terminal of the PMOSFET, the reason for which will be described below.

The voltage driver stage 206 comprises a third inverter 256 including a CMOS pair of PMOSFET m11 258 and NMOSFET m12 260. The gates of the CMOS pair m11 258 and m12 260 are connected together and receive a first input 262 from the gate terminal of m6 222. The third inverter 256 has a third output 264 that outputs an output driver signal at node z, which is the logical inverse of the signal received on the input 262. The drain terminals of M11 258 and M12 260 are tied together to provide the third output 264 of third inverter 256.

In operation when the input signal on the first input 214 at node A transitions to a logical high (at the lower voltage level), m3 210 is off (partially on). It is to be remembered that the input signal on the first input 214 at node A is at the first voltage level, a lower voltage level than that of $V_{DDH}$. Therefore, the source terminal of m3 210 is at a higher voltage than the gate terminal connected to the first input 214. Therefore, m3 210 cannot switch off completely and, as will be described below, the second control stage switch m2 236 will be in a conducting state from the previous cycle of operation with the input signal on the first input 214 at logical low/ground. M4 212 is switched on and pulls first output 216 on node xb to ground. Thus, there will be some leakage current from the high-level voltage supply to ground through m3 210 and m4 212, as is the situation with the circuit of FIG. 1 discussed above.

As the voltage on first output 216 on node xb tends to ground, this causes m5 220 of second inverter 218 to be switched on, m6 222 to be switched off and so the second output 226 on node x goes to high. To recap, the second output 226 at node x is connected to the switch control input 238 of the second control stage switch m2 236 and this logical high on second output 226/node x switches off the second control stage switch 236 thereby cutting out immediately any leakage current from the high-level voltage supply to ground through m2 236, m3 210 and m4 212 to ground. As soon as m2 switches off, the first output 216 at node xb goes fully to ground.

Therefore, the second control stage switch m2 236, which is connected in parallel with the control stage switch m1 232, is configured to assume a non-conducting state dependent on a logical state of the second output signal, which is output on second output 226/node x. The second control stage switch m2 236 comprises a switch control input 238 connected to the second output 226.

In parallel with the operation of the second inverter 218 as described above, as the voltage on the first output 216 at node xb tends to ground, this also causes m11 258 of the third inverter 256 to be switched on, m12 260 to be switched off and so the output driver signal on the third output 264/node z of the third inverter 256 also goes high. Indeed, this is assisted by m2 236 having been switched off.

Turning to the operation of the comparison stage 204 now, as the first comparison stage input 248 receives the input signal on node A, then m8 240 is switched on and m9 244 is switched off. This happens instantaneously as soon as the input signal transitions to logical high. Because the first output signal on the first output 216/node xb has gone to ground, m7 242 is switched on and m10 246 is switched off.

Because both m7 242 and m8 248 are on, and because both m9 244 and m10 246 are switched off, a path exists between the second comparison stage input 250, receiving the second output signal output on second output 226/node x, and the comparison stage output 254 on node y, the second output at the node x is reproduced on the comparison stage output 254/node y. Accordingly, and as described above, because the second output 226/node x is currently at logical high at the higher-level voltage, this is transmitted to node y, and the comparison stage output 254/node y is at logical high. Therefore, the comparison stage 204 is configured for the comparison stage output control signal (on node y) to assume a logical high state when the input signal (on node A) transitions to a logical high state. Further, the first switch m8 240 of the comparison stage 204 is controlled using the input signal (on node A). Additionally, the second switch m7 242 is controlled using the second output signal on node x.

Indeed, the signal on the comparison stage output 254/node y will be at logical high (high-voltage level) when the input signal on node A has a different logical state than the signal on first output 216/node xb.

Embodiments of the invention may operate without the switch m8 240 of the first switch pair, as effectively the operation of switch m8 240 mirrors that of switch m7 242 at least in this point in operation. However, as m8 240 is an NMOSFET in this embodiment, these types of switches are, as is known in the art, not the most efficient when transmitting a logical high signal. Therefore, the provision of m8 240 assists the comparison stage output 254 to achieve the state of the signal on node x more quickly.

As the signal at the comparison stage output 254/node y is now at logical high, this switches off control stage switch m1 232 (in this embodiment, the control stage switch M1 232 is a PMOSFET, with its gate terminal driven by the comparison stage output 254). That is, the control stage switch 232 comprises a switch control input 234 connected to the comparison stage output 254. As a consequence, m1 232 is switched off and there is no leakage current from the high-voltage supply through m3 210 and m4 212 to ground, especially since m2 236 has already been switched off as described above. Therefore, the control stage switch 232 assumes a non-conducting state when the comparison stage output signal (on comparison stage output 254/node y) is in a logical high state.

Consequently, the level shifter 200 attains steady-state operation when the input signal on node A changes state, and goes to ground/logical low. When this happens, the first switch m8 240 of the comparison stage 204 is switched off immediately, and the first switch m9 244 is switched on immediately. M3 210 of the first inverter 208 is switched on immediately, and m4 212 is switched off immediately. However, the first output 216 of the first inverter 208 at node xb does not immediately transition to logical high through m3 210 because both m1 232 and m2 236 remain in non-conducting states from the previous cycle of operation, when the input signal is at logical high, as described above. Consequently, first output 216 on node xb remains at ground, for the time being at least.

As the first output signal on node xb remains at ground, m7 242 remains switched on and m10 246 remains switched off. M11 258 remains on, m12 260 stays off and the third output 264 of the third inverter 260 stays at logical high. In the second inverter 218, m5 220 stays switched on, m6 222 stays switched off, and the second output 226 at node x remains at logical high.

Although m7 242 is still switched on (with the signal on node x at logical high), the comparison stage output 254 at node y is pulled to ground through m9 244 from the fourth comparison stage input 253 replicating the state of node xb. Therefore, the comparison stage 204 includes the third comparison stage input 252 for receiving the first output signal and the second switch pair connected in parallel between the third comparison stage input 252 and the comparison stage output 254. The first switch m9 244 of the second switch pair is controlled with the input signal from node A, which is input to the gate terminal of the first switch m9 244. The second switch m10 246 of the second switch pair is controlled with the first output signal by having its gate terminal connected to the node xb. Note that in this embodiment, the first switch m9 244 of the second switch pair comprises a PMOSFET and the second switch m10 246 comprises an NMOSFET.

As the comparison stage output 254 on node y goes to logical low, it turns on the control stage switch m1 232, which in turn pulls up the voltage on the first output 216 at the node xb to high (at the high-level voltage) because m3 210 is already on, having been switched to a conducting state when the input signal at node A went to logical low.

Then, m11 258 of the third inverter 256 is switched off, m12 260 is switched on and the third output 264 for outputting the output driver signal at node z goes to ground, replicating the logical state of the input signal.

M5 220 of the second inverter 218 is switched off, m6 222 is switched on and the second output 226 for outputting the second output signal at node x goes to ground, also replicating the logical state of the input signal.

Because the signal on node x goes to ground, the second control stage switch m2 236 switches on and there are now two paths through m1 232 and m2 236 from the high-level voltage supply maintaining the first output 216 at node xb at logical high. As the signal on node xb is at high, m7 242 is switched off, and m10 246 is switched on. M9 244 is still on (the input signal on node A is at logical low) and because the signal on node xb has been pulled up to logical high, then this state is reproduced on the comparison stage output 254 on node y; that is, the comparison stage output 254 is pulled back up to logical high as well. Therefore, the comparison stage 204 is configured for the comparison stage output control signal to assume a logical low state when the input signal transitions to a logical low state and, thereafter, for the comparison stage output control signal to assume a logical high state of the input signal maintains a logical low state.

As the comparison stage output control signal on node y assumes a logical high state, this switches off the control stage switch m1 232 but as m2 236 remains in the conducting state, the signal on the first output 216/node xb remains high, and the level shifter 200 attains steady-state operation until the input signal changes state again.

Thus, and as described above, an advantage of having m2 236, which is driven by the second output signal on node x in parallel with m1 232 driven by the comparison stage output, is that m1 232 cuts out the leakage current when the input signal at node A is high, and also to maintain the first output 216 at node xb at logical high, when the input signal on node A is low.

As noted above, the level shifter 200 may provide significant technical benefits when compared to, for example, the conventional circuit of FIG. 1. In this regard, circuit simulation tests were performed. The simulations were conducted with the 55 nm technology node, in the voltage range of 0.9V to 1.32V, with Cl=15ff (capacitance load of 15 femto farad) and slope=0.1 ns (an input signal transition of 0.1 ns time for the transition from ground to logical high or from logical high to ground) with the models of best, worst, typ (typical), bpwn and wnwp, where best means the fastest (MOS behavior under these conditions), worst means the slowest (MOS behavior under these conditions), typ refers to the typical condition on which the chip is working, i.e., the chip is experiencing normal operating conditions or more specifically when PMOS and NMOS are performing typically or as expected. "bpwn" refers to the best PMOS and worst NMOS condition on which the chip is working (i.e. corner conditions or more specifically when PMOS are operating under the best conditions and NMOS are working under worst conditions). "wnwp" refers to the worst NMOS and worst PMOS condition on which the chip is operating (i.e. corner conditions or more specifically when NMOS are working under worst conditions and PMOS are working under worst conditions.

Rise and fall delays were measured across a low to high voltage transition and from a high to low voltage transition, yielding the results shown in Table 1.

TABLE 1

Timing parameters (0.9 V to 1.32 V) for circuit of FIG. 2

Low to High: 0.90 V to 1.32

| Corner | Temp C. | Cell Rise | Cell Fall |
|---|---|---|---|
| Wcs | 25 | 2.44E−10 | 2.38E−10 |
| Typ | 25 | 1.75E−10 | 1.66E−10 |
| Bcs | 25 | 1.29E−10 | 1.22E−10 |
| Bcs | −40 | 1.23E−10 | 1.25E−10 |

TABLE 1-continued

Timing parameters (0.9 V to 1.32 V) for circuit of FIG. 2

Low to High: 0.90 V to 1.32

| Corner | Temp C. | Cell Rise | Cell Fall |
|---|---|---|---|
| Bcs | 125 | 1.37E−10 | 1.19E−10 |
| Bcs | 150 | 1.39E−10 | 1.17E−10 |
| Bnwp | 25 | 1.65E−10 | 1.91E−10 |
| Wnbp | 25 | 1.90E−10 | 1.56E−10 |

In comparison, simulation of the circuit of FIG. 1 yielded the results shown in Table 2.

TABLE 2

Timing parameters (0.9 V to 1.32 V) for circuit of FIG. 1

Low to High: 0.90 V to 1.32

| Corner | Temp C. | Cell Rise | Cell Fall |
|---|---|---|---|
| Wcs | 25 | 1.77E−10 | 5.97E−10 |
| Typ | 25 | 1.34E−10 | 2.87E−10 |
| Bcs | 25 | 1.04E−10 | 1.51E−10 |
| Bcs | −40 | 9.79E−11 | 1.54E−10 |
| Bcs | 125 | 1.15E−10 | 1.45E−10 |
| Bcs | 150 | 1.18E−10 | 1.45E−10 |
| Bnwp | 25 | 1.27E−10 | 2.47E−10 |
| Wnbp | 25 | 1.44E−10 | 3.69E−10 |

Comparing the results shown in tables 1 and 2 indicates that the circuit of FIG. 2 is able to better translate signals in the range of 0.9V to 1.32V for bidirectional operation.

By now it should be appreciated that there has been provided a novel architecture for a single supply digital voltage level shifter, which may be implemented across different libraries and across multiple technologies. In particular, all low-power System on Chip (SoC) designs using multiple voltage domains may advantageously implement the invention, such as the embodiment of FIG. 2.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A single supply digital voltage level shifter comprising:
a first inverter having a first input for receiving an input signal of a first voltage swing, and a first output for outputting a first output signal;
a second inverter having a second input for receiving the first output signal, and a second output for outputting a second output signal of a second voltage swing, the second output signal being a level-shifted version of the input signal;
a comparison stage having a first comparison stage input for receiving the input signal, a second comparison stage input for receiving the second output signal, and a comparison stage output for outputting a comparison stage output control signal; and
a control stage connected in a circuit branch of the first inverter, the control stage having a control stage switch that assumes a non-conducting state dependent on a logical state of the comparison stage output control signal.

2. The voltage level shifter of claim 1, wherein the comparison stage output control signal assumes a logical high state when the input signal transitions to a logical high state.

3. The voltage level shifter of claim 1, wherein the comparison stage comprises a first switch connected between the second comparison stage input and the comparison stage output, wherein the first switch is controlled by the input signal.

4. The voltage level shifter of claim 3, wherein the first switch is a switch in a first switch pair, the first switch pair further comprising a second switch connected in parallel with the first switch of the first switch pair, wherein the second switch is controlled by the first output signal.

5. The voltage level shifter of claim 4, the comparison stage further comprising:
a third comparison stage input for receiving the first output signal; and
a second switch pair connected in parallel between the third comparison stage input and the comparison stage output, a first switch of the second switch pair controlled by the input signal, and a second switch of the second switch pair is controlled by the first output signal.

6. The voltage level shifter of claim 5, wherein the first switch of the second switch pair comprises a P-type MOSFET and the second switch of the second switch pair comprises an N-type MOSFET.

7. The voltage level shifter of claim 4, wherein the first switch of the first switch pair comprises an N-type MOSFET and the second switch of the first switch pair comprises a P-type MOSFET.

8. The voltage level shifter of claim 1, wherein the comparison stage output control signal assumes a logical low state when the input signal transitions to a logical low state and, thereafter, the comparison stage output control signal assumes a logical high state while the input signal maintains a logical low state.

9. The voltage level shifter of claim 1, further comprising:
a third inverter having a third input for receiving the first output signal, and a third output for outputting an output driver signal of the second voltage swing, the output driver signal being a level-shifted version of the input signal.

10. The voltage level shifter of claim 1, wherein the control stage switch comprises a switch control input connected to the comparison stage output.

11. The voltage level shifter of claim 10, wherein the control stage switch assumes a non-conducting state when the comparison stage output signal is in a logical high state.

12. The voltage level shifter of claim 11, wherein the control stage further comprises a second control stage switch connected in parallel with the control stage switch, wherein the second control stage switch assumes a non-conducting state dependent on a logical state of the second output signal.

13. The voltage level shifter of claim 12, wherein the second control stage switch comprises a switch control input connected to the second output.

14. A method of operating a single supply digital voltage level shifter, the method comprising:
providing a first inverter having a first input for receiving an input signal of a first voltage swing, and a first output for outputting a first output signal;
providing a second inverter having a second input for receiving first output signal, and a second output for outputting a second output signal of a second voltage swing, the second output signal being a level-shifted version of the input signal;
providing a comparison stage having a first comparison stage input for receiving the input signal, a second comparison stage input for receiving the second output signal, and a comparison stage output for outputting a comparison stage output control signal;
providing a control stage connected to a circuit branch of the first inverter, the control stage having a control stage switch;
applying the input signal to the first input; and
controlling the control stage switch to assume a non-conducting state dependent on a logical state of the comparison stage output control signal.

15. The method of claim 14, further comprising controlling the comparison stage such that the comparison stage output control signal assumes a logical high state when the input signal transitions to a logical high state.

16. The method of claim 14, further comprising providing a first switch connected between the second comparison stage input and the comparison stage output, the method further comprising controlling the first switch using the input signal.

17. The method of claim 16, wherein the first switch is a switch in a first switch pair, the first switch pair further comprising a second switch connected in parallel with the first switch of the first switch pair, the method further comprising controlling the second switch using the first output signal.

18. The method of claim 17, further comprising:
providing the comparison stage with a third comparison stage input for receiving the first output signal;
providing the comparison stage with a second switch pair connected in parallel between the third comparison stage input and the comparison stage output;
controlling a first switch of the second switch pair using the input signal; and
controlling a second switch of the second switch pair using the first output signal.

19. The method of claim 14, further comprising controlling the comparison stage such that the comparison stage output control signal assumes a logical low state when the input signal transitions to a logical low state and, controlling the comparison stage such that the comparison stage output control signal assumes a logical high state while the input signal maintains a logical low state.

20. The method of claim 14, further comprising:
providing a third inverter having a third input for receiving the first output signal, and a third output that outputs an output driver signal of the second voltage swing, the output driver signal being a level-shifted version of the input signal.

* * * * *